: US 9,028,138 B2
(45) Date of Patent: May 12, 2015

(12) United States Patent
Ben Jamaa et al.

(10) Patent No.: US 9,028,138 B2
(45) Date of Patent: May 12, 2015

(54) ELECTRONIC DEVICE

(71) Applicant: Commissariat a l'energie atomique et aux energies alternatives, Paris (FR)

(72) Inventors: Haykel Ben Jamaa, Grenoble (FR); Julien Buckley, Grenoble (FR); Patrick Leduc, Grenoble (FR)

(73) Assignee: Commissariat á l'énergie atomique et aux énergies alternatives, Paris (FR)

( * ) Notice: Subject to any disclaimer, the term of this patent is extended or adjusted under 35 U.S.C. 154(b) by 270 days.

(21) Appl. No.: 13/713,235

(22) Filed: Dec. 13, 2012

(65) Prior Publication Data

US 2013/0148302 A1    Jun. 13, 2013

(30) Foreign Application Priority Data

Dec. 13, 2011 (FR) .................................. 11 61530

(51) Int. Cl.
| G01N 25/18 | (2006.01) |
| G01K 7/00 | (2006.01) |
| H05K 7/20 | (2006.01) |
| F28F 13/00 | (2006.01) |
| F25D 19/00 | (2006.01) |
| H01L 23/34 | (2006.01) |
| H01L 23/367 | (2006.01) |

(52) U.S. Cl.
CPC .............. H05K 7/2039 (2013.01); F28F 13/00 (2013.01); F25D 19/006 (2013.01); H01L 23/34 (2013.01); H01L 23/367 (2013.01); H01L 2924/0002 (2013.01)

(58) Field of Classification Search
USPC ........................................... 374/44, 183, 163
See application file for complete search history.

(56) References Cited

U.S. PATENT DOCUMENTS

| 4,402,358 | A | 9/1983 | Wolf |
| 4,742,867 | A | 5/1988 | Walsh |
| 5,867,990 | A | 2/1999 | Ghoshal |
| 6,301,114 | B1 | 10/2001 | Ootani |
| 2001/0010488 | A1* | 8/2001 | Minners ......................... 337/131 |
| 2006/0066434 | A1 | 3/2006 | Richards et al. |
| 2006/0152328 | A1* | 7/2006 | Robert .......................... 337/333 |
| 2007/0257766 | A1* | 11/2007 | Richards et al. .............. 337/298 |

(Continued)

OTHER PUBLICATIONS

Banerjee, Kaustave et al., "On Thermal Effects in Deep Sub-Micron VLSI Interconnects," DAC '99 Proceedings of the 36th annual ACM/IEEE Design Automation Conference, pp. 885-891.

(Continued)

*Primary Examiner* — Mirellys Jagan
(74) *Attorney, Agent, or Firm* — Occuhiuti & Rohlicek LLP

(57) ABSTRACT

An electronic device includes a heat source, a heat-absorbing cold point, a thermally insulating material for insulating the heat source from the cold point with a conductivity at a use-temperature of electronic device, that is below a thermal-conductivity threshold, and a thermal bridge having first and second ends connected by pads to the heat source and the cold point, and a thermal switch. The thermal bridge extends between the two ends and switches reversibly between conductive and non-conductive states. It includes material of variable thermal conductivity capable of switching over, in response to an addition of energy, between a conductive phase and a resistive phase, and a control module for causing the thermal switch to switch between the conductive state and the resistive state.

18 Claims, 4 Drawing Sheets

(56) References Cited

U.S. PATENT DOCUMENTS

2009/0040007 A1     2/2009   Stenmark
2012/0051392 A1*   3/2012   Grillberger et al. ............. 374/57
2013/0317388 A1*   11/2013   Bieberich et al. ............. 600/549

OTHER PUBLICATIONS

Brunschwiler et al., "Angle-of-Attack Investigation of Pin-Fin Arrays in Nonuniform Heat-Removal Cavities for Interlayer Cooled Chip Stacks," 27th IEEE Semi-Therm Symposium, pp. 116-124.

An Chen, "Ionic Memories: Status and Challenges," IEEE 2008, 978-1-4244-2411-5, pp. 1-5.

X.Q Chen and T. Saito, H. Yamada, K. Matsushige "*Aligning single-wall carbon nanotubes with an alternating-current field*", Applied Physics Letters, vol. 78, No. 23, Jun. 4, 2001.

Jason Cong and Yan Zhang, "Thermal Via Planning for 3-D ICs," ICCAD '05 Proceedings of the 2005 IEEE/ACM International conference on Computer-aided design, pp. 745-752.

Gilles Poupon et al., "3D Integration : a technological toolbox," IEEE (2008) 978-4244-3624-8/08, Microsystems, Packaging, Assembly & Circuits Technology Conference, 2008. IMPACT 2008. 3rd International.

Vladimir Szekely et al., <<Tracing the Thermal Behavior of ICs, >> IEEE Design & Test of Computers, Apr.-Jun. 1998, pp. 14-21.

* cited by examiner

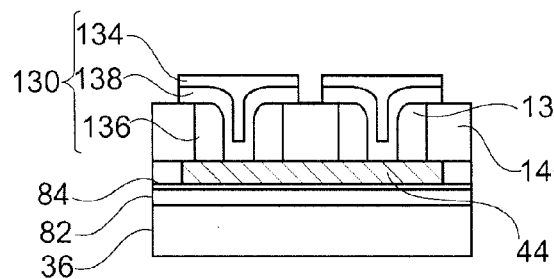
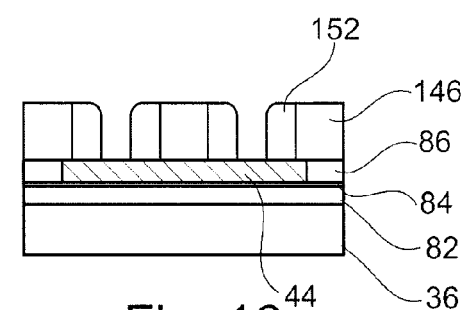
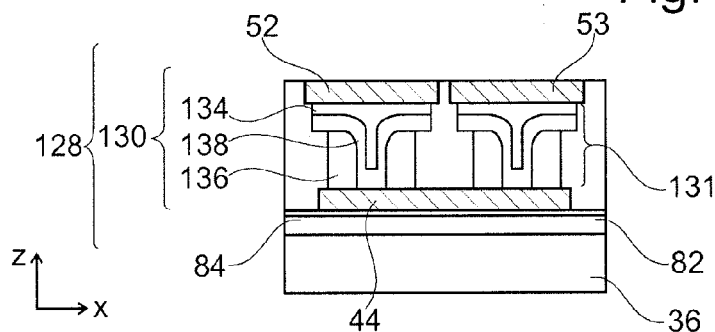
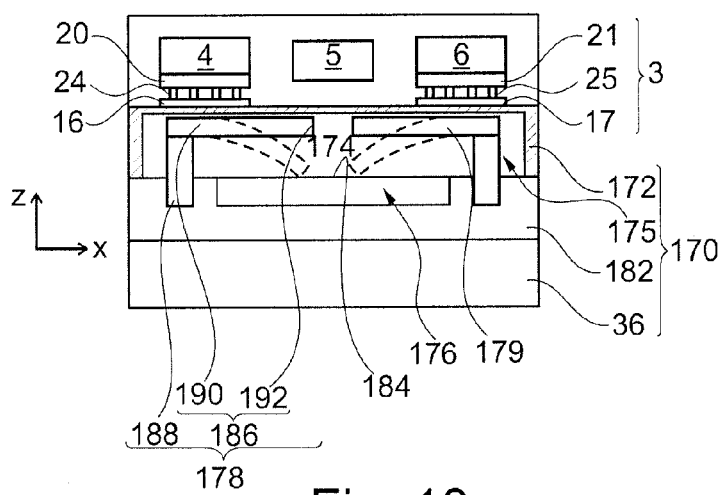

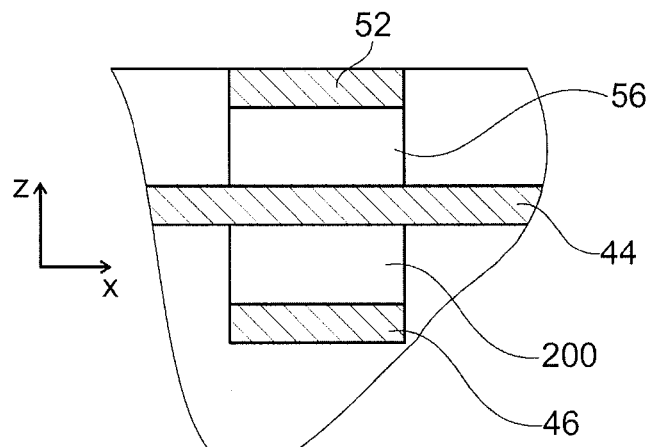
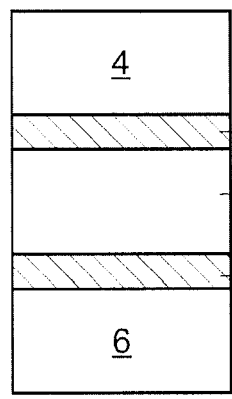
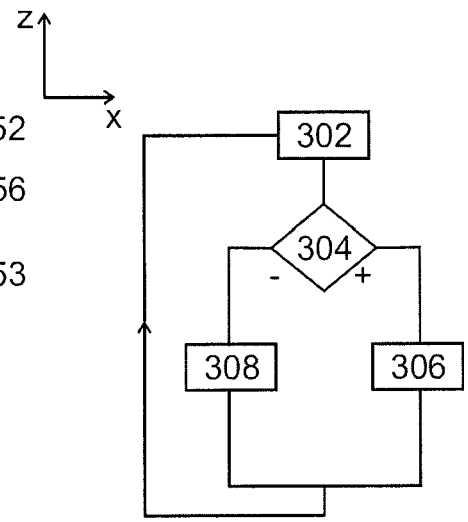
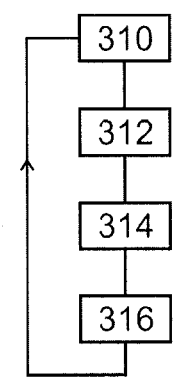
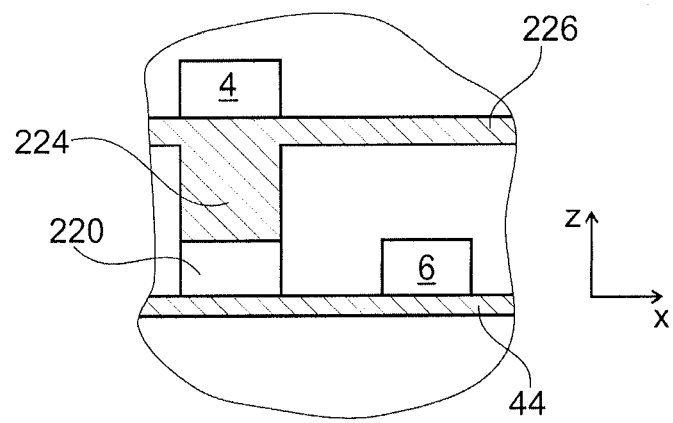

ELECTRONIC DEVICE

CROSS-REFERENCE TO RELATED APPLICATIONS

Under 35 USC 119, this application claims the benefit of the priority date of French Patent Application 1161530, filed Dec. 13, 2011, the content of which is herein incorporated by reference.

BACKGROUND OF THE INVENTION

The invention pertains to an electronic device as well as to a plate for this electronic device.

The performance of an electronic device often depends on the capacity to cool it efficiently. To this end, a prior-art electronic device comprise:
- at least one heat-generating heat source,
- at least one cold point capable of absorbing heat,
- a thermally insulating material of which the thermal conductivity at the temperature of use $T_f$ of the device is below a threshold $S_1$, this material thermally insulating the heat source from the cold point, and
- at least one thermal bridge extending between at least two ends thermally connected respectively to the heat source and to the cold point.

The term "temperature of use" is understood to mean the average temperature of the environment in which the electronic device works.

In these prior-art electronic devices, the thermal bridge is typically at least one track made out of metal or out of a semiconducting material that extends continuously from one end to the other. Such thermal bridges enable the flow of heat to be directed from the heat source to the cold point and therefore to improve the cooling of the electronic device. In several prior-art electronic devices, the thermal bridge is non-existent or has little efficiency.

The heat source may be any unspecified heat-dissipating electronic module, for example capacitor-based and inductor-based resistors or oscillators. However, the heat source is often an electronic module made with transistors. In the prior-art electronic devices, especially nomad electronic devices, the activity of an electronic module can vary greatly. For example, an electronic module can pass from an inactive state in which it is not powered or little used towards an active state in which it is highly used. In the inactive state it produces no heat or relatively little heat. Conversely, in the active state, it can produce a lot of heat, thus causing a great increase in its temperature.

Thus, in electronic devices of this kind, the heat source is not always at the same place. Furthermore, depending on the activity of the electronic device, the electronic module to be cooled as a priority is not always the same.

Known thermal bridges do not allow for a satisfactory response to these changes in the operating condition of the electronic device. In this respect, they show low efficiency in distributing heat efficiently in the electronic device. The prior art is also known from:
- US2009/040007 A1,
- U.S. Pat. No. 5,867,990 A,
- U.S. Pat. No. 6,301,114 B1,
- U.S. Pat. No. 4,402,358 A,
- US2006/066434 A1,
- U.S. Pat. No. 4,742,867 A.

SUMMARY OF THE INVENTION

The invention seeks to overcome this drawback. An object of the invention therefore is an electronic device according to claim 1. Through the presence of a thermal switch in the thermal bridge, this bridge can be reconfigured automatically so as to adapt with the utmost efficiency to the activity and state of operation of the electronic device. Thus, the flows of heat in the electronic device can be controlled and optimized, thus making it possible ultimately to augment the performance of this electronic device.

The embodiments of this electronic device may comprise one or more of the characteristics of the dependent claims. These embodiments of the electronic device furthermore have the following advantages:
- the use of a material of variable thermal conductivity makes it possible to avoid having to use moving parts that move mechanically in order to switch over between the conductive and resistive states;
- the use of a solid electrolyte to make the material of variable thermal conductivity facilitates the fabrication of the electronic device because such materials are simple to incorporate into the electronic device in using the classic methods of fabrication in microelectronics;
- the use of thermal switches, for which the changing of the thermal conductivity can be non-volatile, makes it unnecessary to have a continuous addition of energy in order to remain in a predefined state.

An object of the invention is also a plate for the above electronic device according to claim 11.

The embodiments of this plate may comprise one or more of the characteristics of the dependent claims pertaining to the plate.

These embodiments of the plate furthermore have the following advantages:
- the fact of having a buried track within a substrate connected to the end pads by means of thermal switches enables efficient control of the flow rate of the heat flows between different points of the contact face;
- the use of a thermal switch to thermally connect and, alternately, to thermally insulate thermally conductive tracks enables greater flexibility as regards the way in which heat is distributed between the different pads of the contact face.

BRIEF DESCRIPTION OF THE DRAWINGS

The invention will be understood more clearly from the following description given purely by way of a non-exhaustive example and made with reference to the appended drawings, of which:

FIG. 14 is a schematic illustration in vertical section of another embodiment of the plate of FIG. 1;

FIG. 15 is a flow chart of a method for fabricating the plate of FIG. 14;

FIGS. 16 and 17 are schematic illustrations in vertical section of different steps for fabricating according to the method of FIG. 15;

FIG. 18 is a schematic illustration in vertical section of another embodiment of the plate of the electronic device of FIG. 1;

FIGS. 19 to 21 are partial schematic illustrations in vertical section of other different embodiments of the plate of the electronic device of FIG. 1;

FIGS. 22 and 23 are flow charts of variants of the method of operation of FIG. 3.

DETAILED DESCRIPTION

Here below in the description, the same elements carry the same numerical references in the figures. The devices and functions well known to those skilled in the art are not described here in detail.

Figure 1:
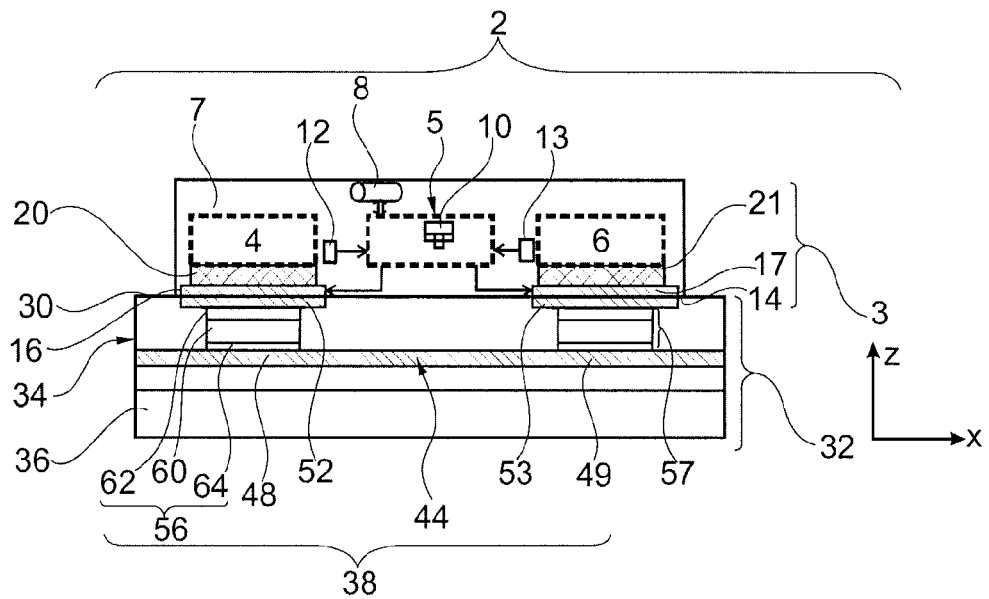
FIG. 1 is a schematic illustration in vertical section of an electronic device equipped with a plate for its cooling.

FIG. 1 shows an electronic device 2. The device 2 comprises an integrated circuit 3. Here, this integrated circuit 3 is a 2D type integrated circuit. An integrated circuit of this kind is formed by heat-dissipating electronic components disposed in a same lower plane which extends horizontally. The horizontal plane is parallel to two orthogonal directions X and Y. The vertical direction is represented by the direction Z perpendicular to the directions X and Y. The integrated circuit 2 can possibly comprise electronic components laid out in several upper planes situated above the lower plane in the vertical direction. In this case, it is a 3D type integrated circuit. The electronic components of the upper plane are electrically connected to the electronic components of the lower plane by means of vertical electrical connections better known by the term "vias".

Heat-dissipating electronic components are typically electronic components capable of changing their state in response to a command. At each change of state, a part of the energy contributed to the electronic components is dissipated in the form of heat. Typically, the electronic components are transistors. These electronic components are brought together locally and interconnected with one another to form electronic modules which fulfill predetermined functions such as for example those of an electronic microprocessor or coprocessor or those of telecommunications modules. The electronic modules are thermally insulated from one another by means of thermally-insulating material 7.

Here below in this description, when an electronic module of this kind works, it is said to be active. An active electronic module therefore converts a part of the energy that it receives in the form of electricity into heat, chiefly because of the switching over of the different transistors that form it between their on states and off states. Thus, each active electronic module constitutes a heat source.

Conversely, when an electronic module does not work, it is said to be inactive. Each inactive electronic module can absorb heat instead of producing it. Indeed, an inactive module is not powered. In this case, it can fulfill the cold point function.

To simplify FIG. 1, only three electronic modules 4 to 6 of the integrated circuit 3 have been shown. For example, the electronic module 5 is a programmable electronic computer unit capable of executing instructions recorded on an information recording carrier. To this end, it is connected to a memory 8. By way of an illustration, the memory 8 is housed inside the integrated circuit 3. The memory 8 contains the instructions needed to execute the method of FIG. 3. In particular, the module 5 implements a programmable control module 10.

The integrated circuit 3 comprises a lower face 14 made of a thermally insulating and electrically insulating material. The face 14 may be the upper face of the integrated circuit during the fabrication phase and becomes its lower face when it is turned over during the bonding of the circuits following the method known as the "flip chip" method. Pads made out of a thermally conductive and electrically conductive material are flush with this face 14. Here, a material is said to be "thermally conductive" if its thermal conductivity at the temperature $T_f$ of use of the device 2 is at least three times and preferably 100 times or 300 times greater than the thermal conductivity at the temperature $T_f$ of the thermally isolating material. Here below in this description, all the values of thermal conductivity are given for the temperature $T_f$. Here, the temperature $T_f$ is taken to be equal to 20° C. Typically, the thermal conductivity at the temperature $T_f$ of a thermally conductive material is higher than 150 or 300 W/K/m. Conversely, the thermal conductivity of a thermally insulating material at the temperature $T_f$ is strictly lower than 150 W/K/m (which corresponds to average thermal conductivity) and preferably below 20, 10 or 1 W/K/m.

A material is considered to be electrically conductive if its resistivity at the temperature $T_f$ is smaller than $10^{-2}$ or $10^{-5}$ Ω·m. Conversely, an electrically insulating material typically has electrical resistivity at the temperature $T_f$ greater than $10^2$ or $10^3$ Ω·m.

For example, the thermally insulating material is $SiO_2$ or a polymer. Here, the thermally insulating material is $SiO_2$.

For example, the thermally conductive material is copper, silver, tungsten, graphene or diamond. Here below in this description, it is assumed that the thermally conductive material is copper unless otherwise stated.

To simplify FIG. 1, only two pads 16, 17 flush with the lower face 14 have been shown. Each pad 16, 17 is thermally connected to a respective electronic module. Here, the pads 16 and 17 are thermally connected respectively to the electronic modules 4 and 6. To this end, for example, each pad 16, 17 is connected to a pattern, 20, 21 respectively in thermal contact with the electronic module. The patterns 20 and 21 are a region of separation between the electronic modules 4 and 6 and the pads 16 and 17. The patterns 20 and 21 each form a preferred passage for the flow of heat circulating between the pads 16, 17 and the modules 4, 6 respectively. For this purpose, their thermal conductivity is preferably close or equal to or greater than that of the thermally conductive materials. They may be formed by a fine layer made out of an electrically insulating or conductive or semiconducting material or a set of two or more materials from among these materials. The term "fine" layer designates layers whose thickness is below 10μ and typically below 1 μm or 500 nm. The thickness of these layers is therefore small enough to consider that thermal contact has been set up whatever the nature of the material used to make this fine layer. These layers or patterns can be structured and may contain for example vias or lines made out of thermally conductive material such as a metal. The presence of the vias however is not indispensable.

The pads 16, 17 are electrically connected to the module 5 so that the control module 10 can apply a voltage to them.

The integrated circuit 2 comprises a network of temperature sensors each capable of measuring the temperature of a respective electronic module. Typically, each sensor is placed in proximity to the electronic module for which it must measure the temperature. Thus, each sensor is more sensitive to the temperature of the electronic module located in its proximity than to the temperature of the other electronic modules. Each sensor is connected to the electronic module 5 to communicate the measured temperature to the control module 10. To simplify FIG. 1, only two temperature sensors 12 and 13 are shown, respectively, in proximity to the modules 4 and 6.

The lower face 14 of the integrated circuit 2 is bonded to an upper face 30 of a plate 32. The upper face 30 is the face of a block 34 made out of a thermally and electrically insulating material. The block 34 is a single layer or several layers made out of thermally insulating material stacked on one another. This block 34 extends essentially in a horizontal plane. Here, this block 34 is disposed on a silicon substrate 36.

The plate 32 comprises at least one thermal bridge 38. The thermal bridge 38 comprises:
- a grating 40 made out of a thermally conductive material, end pads made out of a thermally conductive and
- electrically conductive material flush with the upper face 30,
- thermal switches interposed between each end pad and the grating 40.

The grating 40 extends continuously in a horizontal plane. This grating 40 is buried within the block 34.

Figure 2:
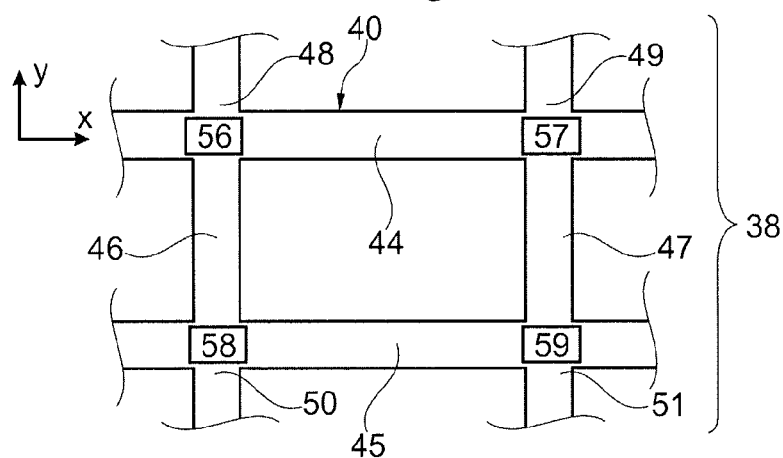
FIG. 2 is a schematic and partial illustration of a thermally conductive grating used in the plate of FIG. 1 to cool electronic modules.

FIG. 2 shows a more detailed view of this grating 40. It has several tracks made out of a thermally conductive material extending in parallel to the direction X and other tracks made out of a thermally conductive material extending in parallel to the direction Y. The tracks parallel to the direction X are identical to one another. Similarly, the tracks parallel to the direction Y are identical to one another and identical to the tracks parallel to the direction X except for their direction. To simplify FIG. 2, only two tracks 44 and 45, parallel to the direction X and only two tracks 46 and 47 parallel to the direction Y have been shown.

Each intersection between a track parallel to the direction X and a track parallel to the direction Y is constituted by a track part common to these two tracks. In FIG. 2, the intersections between the track 44 and the tracks 46 and 47 bear the references, respectively, 48 and 49 and the intersections between the track 45 and the tracks 46 and 47 bear the references, respectively, 50 and 51.

The grating 40 is permanently connected to a reference potential such as the ground.

An end pad is situated above and vertically to each intersection of the grating 40. In FIG. 1, only the pads 52 and 53 facing the intersections 48 and 49 are shown. These pads 52 and 53 are directly in mechanical contact with, respectively, the pads 16 and 17 of the integrated circuit 3.

In FIG. 1, only the thermal switches 56 and 57 interposed, respectively, between the intersection 48 and the pad 52 and between the intersection 49 and the pad 53 are shown. In FIG. 2, the thermal switches disposed above the intersections 50 and 51 respectively bear the references 58 and 59. Here, all the thermal switches are identical and only the switch 56 shall now be described in detail.

The switch 56 is capable, in response to a command from the module 10, of switching over reversibly between:
- a conductive state in which the value $\lambda_c$ of its thermal conductivity is greater than the value $\lambda_i$ of the block 34,
- a resistive state in which the value $\lambda_r$ of its thermal conductivity is smaller than the value $\lambda_c$.

Preferably, the value $\lambda_r$ is smaller than or equal to the value $\lambda_i$.

Typically, the ratio $\lambda_c/\lambda_r$ is greater than 2 or 2.5, preferably greater than 5 or 10 in normal conditions of the commanding of this switch.

In this embodiment, the thermal switch 56 is made out of a material with variable thermal conductivity. Here, this material is a solid electrolyte 60.

The electrolyte 60 is directly in mechanical contact, on the upper side, with a soluble electrode 62 and, on the lower side, with an inert electrode 64.

The electrolyte 60 is capable of switching over between a conductive phase in which the value of its thermal conductivity is equal to $\lambda_c$ and a resistive phase in which the value of its thermal conductivity is equal to $\lambda_r$.

The thermal conductivity of the switch 56 passes from the value $\lambda_r$ to the value $\lambda_c$ in response to the application of a difference in potentials between its electrodes 62 and 64. Indeed, when there is a difference in potentials between its electrodes, the electrode 62 gets dissolved in the electrolyte 60, thus increasing the thermal conductivity of the electrolyte 60.

Furthermore, in an embodiment of this kind, the thermal conductivity of the electrolyte 60 remains equal to $\lambda_c$ even after the difference in potentials has disappeared. To bring the thermal conductivity of the switch 56 to its value $\lambda_r$, a potential difference of an opposite sign needs to be applied.

Here, the switch 56 is made as a cell of a CBRAM (conductive bridging random-access memory) or PMC (programmable metallization cell) or OxRAM (oxide resistive random-access memory), or generally a RRAM (resistive random-access memory). To make the switch 56, reference can therefore be made to documents pertaining to the fabrication of these memory cells. For example, the following article describes different embodiments of these memory cells:

An Chen, "*Ionic memories: Status and challenges*", 978-1-4244-24115, IEEE 2008.

For example, the electrolyte 60 consists of more than 90% or 98% of an element or elements chosen from the following group:
- metal sulfites such as $Cu_2S$, $Ag_2S$,
- germanium-based chalcogenides such as GeSe,
- metal oxides such as $Ta_2O_5$, $WO_3$, $SiO_2$, $TiO_2$,
- ZnCdS, $GdO_x$/Cu—Te.

The electrode 62 is made out of a material having a redox potential enabling it to get ionized and a diffusion coefficient enabling it to dissolve in the electrolyte 60. The electrode 62 is typically chosen from the group formed by copper, silver and zinc.

The electrode 64 is made out of a material that does not react with the electrolyte 60. For example, it is a TiN alloy.

The working of the device 2 shall now be described with reference to FIG. 3. The plate 32 is controlled so that the temperature of an electronic module or other electronic modules in the immediate neighborhood of this electronic module does not rise excessively.

Initially, the set of thermal switches of the plate 32 are in their resistive state.

At a step 70, the sensors 12 and 13 measure the temperatures of the electronic modules 4 and 6 of the device 2.

At a step 72, the control module 10 acquires these measurements.

Then, at a step 74, the module 10 determines which electronic modules, if any, need to be cooled. The term "to cool" herein designates not only the fact of lowering the temperature of this module but also that of limiting or preventing an increase in the temperature of this module. For example, the module 10 considers an electronic module to be in need of being cooled if its temperature goes beyond a threshold $T_c$.

At a step 74, the module 10 also determines which are the electronic modules for which the temperature is low, i.e. for which the temperature is below a threshold $T_f$ and for which the temperature can be increased without any risk of damage. For example, the temperature in question is typically that of an inactive electronic module.

If there is at least one electronic module for which the temperature exceeds the threshold $T_c$, then the module 10 proceeds to the step 76. Here, it is assumed that it is the electronic module 4 that is working and that must be cooled while the module 6 is inactive and can therefore serve as a cold point.

At the step 76, the module 10 commands the switches 56, 57 of the thermal bridge 38 to thermally connect the modules 4 and 6 in order to limit the increase in the temperature of the module 4. To this end, the module 10 causes the switches 56 and 57 to switch over to their conductive state. More specifically, at the step 76, the module 10 applies a voltage pulse to the pads 16 and 17 to create the difference in potentials needed for the switches 56 and 57 to switch over from their resistive state to their conductive state. Typically, the duration of the pulse is less than is or 1 μs. The amplitude of the voltage pulse is for example lower than 5 or 1V.

When the switches 56 and 57 are in the conductive state, the heat generated by the module 4 gets diffused towards the module 6 by means of the switches 56, 57 and the track 44. Thus, this limits the increase in temperature of the module 4 and conversely, increases the temperature of the module 6.

If, at the step 74, the temperature of the electronic modules 4 and 6 does not exceed or no longer exceeds the threshold $T_c$, then the operation proceeds to a step 78. At the step 78, the module 10 commands the switches 56, 57, previously switched over into their conductive state, in order to switch them over into their resistive state.

The steps 70 to 78 are reiterated in a loop so as to permanently optimize the distribution of the heat flows within the device 2. This especially makes it possible to make the internal temperature of the device 2 uniform more efficiently and therefore, ultimately, to increase the performance of this device and especially of the integrated circuit 3.

Figure 4:
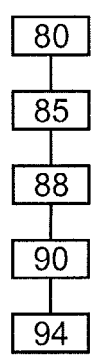
FIG. 4 is a flowchart of a method for fabricating the electronic device of FIG. 1.

FIG. 4 shows a method for fabricating the plate 32 while FIGS. 5 to 8 give a more detailed view of the steps for fabricating this plate 32.

Figure 5:
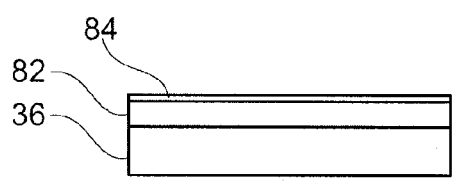
FIGS. 5 to 8 are schematic illustrations of different steps of fabrication of the method of FIG. 4.

At a step 80, the substrate 36 on which there is deposited a layer 82 made of thermally insulating material and an etch stop layer 84 is produced (FIG. 5). For example, the thermally insulating material is $SiO_2$.

Figure 6:
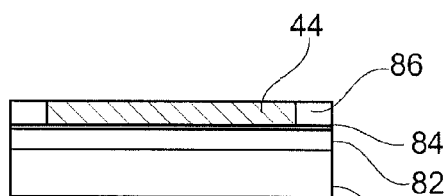

At a step 85, the tracks of the grating 40 are deposited. For example, these tracks are made of copper and are deposited by means of a Damascene process (FIG. 6). In FIG. 6, only the track 44 has been shown. The thickness of the track 44 is preferably smaller than 10 μm or 1 μm or 400 nm. Its thickness is also preferably greater than 50 nm. The spaces between the different tracks of the grating 40 are filled with a thermally insulating material 86.

At a step 88, a thermal switch is made on each intersection of the tracks of the grating 40. To this end, the following are successively deposited and etched:
 the electrode 64,
 the solid electrolyte 60, and then
 the electrode 62.

For example, here the electrolyte is $SiO_2$ while the electrode 62 is made of silver.

Figure 8:
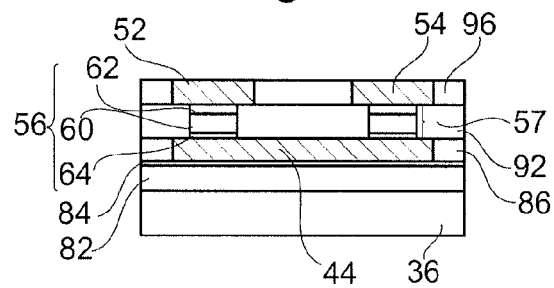
Figure 7:
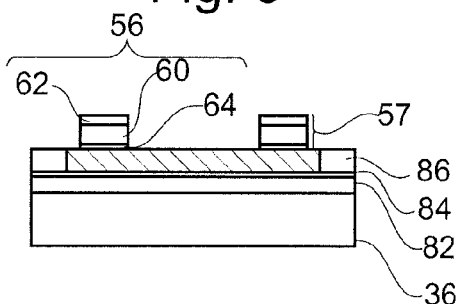
Figure 10:
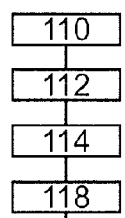
FIG. 10 is a flowchart of a method for fabricating the plate of FIG. 9.

At a step 90, a layer 92 made of a thermally insulating material is deposited and then planarized to allow the electrode 62 to be flush (FIG. 8).

Finally, at a step 94, the end pads 52 and 53 are directly defined on the electrode 62 (FIG. 8) according to the Damascene method as follows: a layer of a thermally insulating material 96 is deposited and apertures of the end pads 52 and 53 are made in this insulator. Then, the material of the end pads 52 and 53, for example copper, is deposited to fill the apertures. A planarization of this structure then enables the end pads 52 and 53 to be defined. The layers 82, 84, 86, 92 and 96 form the block 34.

The integrated circuit 3 is fabricated in parallel with the steps 80 to 94 by fabrication methods known in microelectronics.

Finally, at a step 96, the plate 32 thus made is bonded typically by molecular bonding to the lower face 14 of the integrated circuit 3 so that the pads 16 and 17 are bonded to the corresponding pads 52 and 53 of the plate 32.

Figure 9:
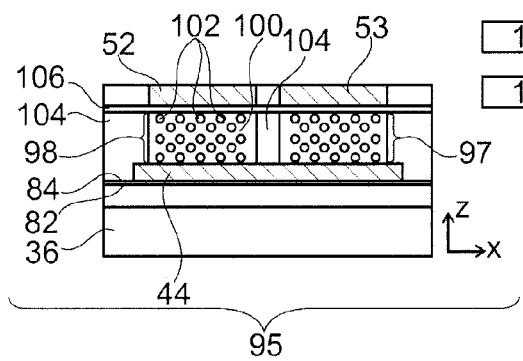
FIG. 9 is a schematic illustration in vertical section of another embodiment of the plate of FIG. 1.

FIG. 9 shows a plate 95 identical to the plate 32 except that the switches 56 and 57 are replaced by switches 97 and 98 respectively. In this embodiment, the material with variable thermal conductivity is a thermally insulating fluid 100 mixed with thermally conductive nanoparticles 102. Here, the fluid 100 is a thermally insulating liquid such as a liquid electrolyte. For example, it is ethanol.

The nanoparticles 102 are nanoparticles that get aligned with the electrical field lines that appear when there is a difference in potentials between the pads 52 and 53 and the track 44. When these nanoparticles get aligned, they form a multitude of microscopic thermal bridges between the pads 52 and 53 and the track 44, thus reducing the thermal conductivity of the switch.

Preferably, the nanoparticles 102 have a high aspect ratio or shape factor, i.e. the ratio of their length to their width is typically greater than 2, 10 or 100. For example, the nanoparticles 102 are carbon nanotubes or fullerenes. The alignment of these nanoparticles on the electrical field is described for example in the following article:

X. Q Chen and T. Saito, H. Yamada, K. Matsushige "*Aligning single-wall carbon nanotubes with an alternating-current field*", Applied Physics Letters, Vol. 78, No. 23, 4 Jun. 2001.

The nanoparticles 102 are contained in cavities, the bottom of which is formed by the upper face of the track 44 and the vertical wall of which is formed by vertical walls 104 made of a thermally insulating material. Here, the cavity in which the liquid 100 is received is closed by a silicon lid 106. Preferably, the thickness of this lid is small, i.e. for example smaller than 10 μm and preferably smaller than 400, 100 or 30 nm.

Figure 3:
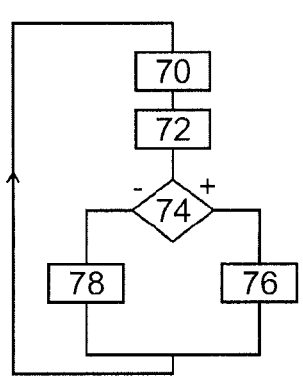
FIG. 3 is a flowchart of a method of operation of the electronic device of FIG. 1.

The working of this plate 95 when associated with the integrated circuit 3 is identical to the one described here above with reference to FIG. 3.

The method of fabrication of this plate 95 shall now be described by means of the method of FIG. 10 and FIGS. 11 to 13.

Figure 11:
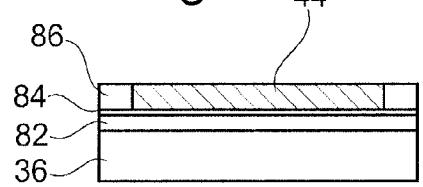

The fabrication of the plate 95 starts with steps 110 and 112 respectively identical to the steps 80 and 85 of FIG. 4. The plate in the state represented in the FIG. 11 is then obtained.

Figure 12:
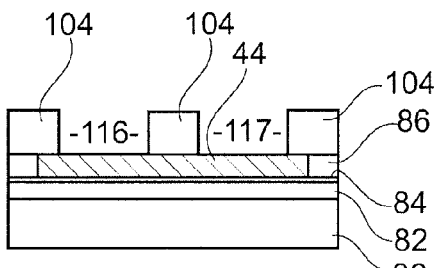
FIGS. 11 to 13 are schematic illustrations of different steps of the method of FIG. 10.

Then, at a step 114, a layer of thermally insulating material is deposited and then etched to form the vertical walls 104. These vertical walls 104 define cavities above each intersection of the grating 40 (FIG. 12). In FIG. 12, only two cavities 116 and 117 respectively situated above the intersections 48 and 49 have been shown. The bottom of these cavities is formed by the track 44.

At a step 118, each of the cavities is filled with the fluid 100 mixed with the nanoparticles 102.

Figure 13:
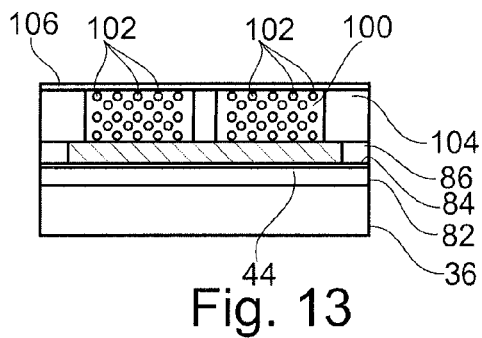

Then, at a step 120, the lid 106 is deposited and bonded to the top of the walls 104 to close each of the previously filled cavities (FIG. 13). The lid can be further thinned after the bonding.

At a step 122, the end pads 52 and 53 are formed similarly to what was described at the step 94.

Then, at a step 124, the plate 95 is bonded by molecular bonding to the lower face 14 of the integrated circuit 3.

FIG. 14 shows a plate 128 identical to the plate 32 except that the switches 56 and 57 are replaced by switches 130 and 131. These switches 130 and 131 are identical and only the switch 130 shall now be described in detail. The switch 130 comprises the soluble electrode 134 and an inert electrode 136 positioned vertically to increase the intensity of the electrical field lines created between these two electrodes. Here, the electrode 136 forms the vertical flanks of a cavity filled with a solid electrolyte 138. The electrode 134 forms a vertical rod which extends into the cavity filled with the electrolyte 138 so that this electrolyte is essentially interposed between this vertical rod and the vertical inert electrode 136. Here, the electrode 134 and the electrolyte 138 are made out of the same materials as, respectively, the electrode 62 and the electrolyte 60. The electrode 136 is made out of silicide.

FIG. 15 shows a method of fabrication of the plate 128. This method starts with the steps 140 and 142 which are identical to the steps 80 and 85 of FIG. 4.

Then, at a step 144, a layer 146 (FIG. 16) made of thermally insulating material is deposited on the grating 40.

At a step 148, the layer 146 is etched to form cavities above each intersection of the tracks of the grating 40. The bottom of this cavity is formed by the intersection of the tracks of the grating 40.

At a step 150, a layer 152 (FIG. 16) of amorphous silicon or polycrystalline silicon is deposited on the layer 146 and then etched anisotropically so as to allow this layer 152 to remain only on the vertical walls of the hollowed cavities. The thickness of this layer 152 typically ranges from 10 nm to 800 µm.

At a step 154, a film of nickel or platinum is deposited on the layer 152. To simplify the figures, this film has not been shown.

At a step 156, the layer 152 is annealed at a temperature typically ranging from 200° C. to 400° C. to transform the layer 152 into the layer 136 of silicide.

At a step 158, an electrolyte-forming layer 138 and an electrode-forming layer 134 are successively deposited and etched so as to obtain the electrolyte 138 and the electrode 134 (FIG. 17). The electrode 134 can be planarized at this level. The following steps 160, 162 and 164 are respectively identical to the steps 90, 94 and 96 of FIG. 4.

FIG. 18 shows another plate 170 bonded to the lower face 14 of the integrated circuit 3 to diffuse the heat of the electronic module 4 towards the electronic module 6 when this is necessary. More specifically, the lower face 14 is bonded to the roof of a lid 172 closing a cavity 174 filled with a thermally insulating fluid such as air. The plate 170 comprises the thermal bridge 175. This bridge 175 comprises:
 a track 176 made of a thermally conductive material, and
 two thermal switches 178 and 179.

The track 176 is buried within a layer 182 made of a thermally insulating material so that only an upper face 184 of this track is flush with the interior of the cavity 174. This track 176 is connected to a reference potential such as the ground. It extends horizontally between a left end closer to the pad 16 than to the pad 17 and a right end closer to the pad 17 than to the pad 16. The layer 182 and the thermally insulating fluid trapped in the cavity 174 form a block of thermally insulating material within which the track 176 is completely buried.

The thermal switches 178 and 179 are placed respectively between this left end and the pad 16 and between this right end and the pad 17. The switches 178 and 179 are identical and only the switch 178 shall now be described in greater detail.

The switch 178 comprises a flexible strip 186 and an electrode 188.

The strip 186 extends between a fixed end 190 and a free end 192.

The end 190 is fixed without any degree of freedom in proximity to the pad 16. In particular, this end 190 is closer to the pad 16 and preferably at least two or three times closer to the pad 16 than to the upper face 184 of the track 176. Here, this end 190 is separated from the pad 16 solely by a fine layer of thermally insulating fluid and by the roof of the lid 172. Thus, the part of the roof of the lid 172 facing the end 190 forms an end pad of the thermal bridge 175.

The strip 186 can be shifted between:
 an open position in which the end 192 is separated from the track 176 by a thickness e of thermally insulating fluid at least two and preferably at least 10 or 50 times greater than the thickness of thermally insulating fluid between the end 190 and the roof of the lid 172, and a closed position in which this free end is directly in mechanical contact with the upper face 184 of the track 176.

In FIG. 18, the open position has been shown in a solid line while the closed position has been shown in dashes.

In the open position, the strip 186 extends horizontally, while in the closed position the strip 186 is curved downwards. The strip 186 is made out of a thermally conductive material.

The positions of the ends 190 and 192 are chosen so that the value of the thermal conductivity of the switch 178 is equal to $\lambda_r$ in the open position and equal to $\lambda_c$ in the closed position. As above, the ratio $\lambda_c/\lambda_r$ is greater than 2 or 2.5 and, preferably, greater than 5 or 10.

Thus, the open position corresponds to the resistive state of the switch while the closed position corresponds to the conductive state.

The electrode 188 is a vertical pin. The upper end of the electrode 188 is fixed without any degree of freedom to the end 190 of the strip 186. The lower end of the electrode 188 is anchored in the layer 182.

The electrode 188 is made out of an electrically conductive material. It is electrically connected to the module 10 by an electrical link which is not shown. It is also thermally insulated from the track 176 by the layer 182.

When the module 10 applies a difference in potentials between the electrode 188 and the track 176, the strip 186 gets curved and shifts from its open position towards its closed position. When the strip 186 is in the closed position, it is conformated so that it remains bonded to the track 176 even when there is no difference in potentials initially used to shift it towards this closed position. Thus, to return to the resistive state, the module 10 applies a difference in potentials of an opposite sign to bring the strip 186 from its closed position to its open position. The rest of the working of the plate 170 is similar to that of the plate 32. Thus, it is not necessary for these thermal switches to be made out of material of variable conductivity.

The electronic device can work without any automatic control loop managed by the control module 10. In this case, no estimation or measurement of the temperature is indispensable, or a simplified estimation of the temperature is used. For example, the device is managed by the module 10 as a function of the "on" or "off" state of the electronic modules forming the heating points. The thermal bridge connects a heat source to a cold point as soon as the electronic modules corresponding to them are turned on and off respectively. As soon as both switches are turned on or off simultaneously, the control 10 simultaneously closes the thermal switches of the thermal bridge connecting them. If only one of the electronic modules is turned on while the other is off, then the module 10 simultaneously opens the thermal switches of the thermal bridge connecting them.

This principle is illustrated by the method of FIG. 22 in the particular case of the modules 4 and 6.

At a step 302, the module 10 detects whether the electronic modules 4, 6 are in heat source mode. An electronic module is said to be in heat source mode when its heat density is greater than a threshold value $Q_1$. The value $Q_1$ is generally greater than 1 W/cm$^2$, but it can be smaller than 1 W/cm$^2$ or 0.5 W/cm$^2$ or 0.1 W/cm$^2$ if the application that uses the electronic modules is sensitive to heat.

At a step 304, the module 10 verifies that the two electronic modules 4 and 6 are simultaneously in heat source mode.

Should the two electronic modules be simultaneously in heat source mode or should both be simultaneously not in heat source mode, then at a step 306, the module 10 causes the two thermal switches 56 and 57 to switch into the resistive state.

If precisely one and only one of the two modules should be in heat source mode, then at a step 308 the module 10 automatically causes the two thermal switches 56, 57 to switch into the conductive state.

These steps 302 to 308 are reiterated in a loop so as to improve the distribution of the heat flows within the device 2.

In another embodiment, the device can work without any control loop managed by the module 10 and without estimation or measurement of the temperature of the heat source or of the cold point. For example, the module 10 manages the thermal switches of the thermal bridge periodically, with a period of several seconds in general, or a few microseconds, and in certain cases a few nanoseconds. In this case, the opening and closing of the thermal switches serves to homogenize the temperature of the electronic device at a temperature between that of the heat source and that of the cold point, the value of which depends on the periodicity at which the states of the thermal switches get switched over. The speed at which the temperature of the electronic device is uniformized also depends on the periodicity at which the thermal switches get switched over.

This principle is illustrated in the method of FIG. 23 in the particular case of the modules 4 and 6. At a step 310, the module 10 switches the two thermal switches 56, 57 of the thermal bridge into the conductive state.

Then, at a step 312, the module 10 awaits a predetermined time, generally several seconds or a few microseconds and in certain cases a few nanoseconds.

At a step 314, the module 10 switches the two thermal switches 56, 57 of the thermal bridge into the resistive state.

At a step 316, the module 10 waits for a predetermined time which may be different from that of the step 312.

The steps 310 to 316 are thus reiterated in a loop to homogenize a temperature of the device 2 at a temperature between that of the heat source and that of the cold point, the value of which depends on the periodicity of switching of the states of the thermal switches.

Many other embodiments are possible. For example, other embodiments of the grating 40 are possible. For example, the tracks which extend in parallel to the direction X are not necessarily thermally connected permanently to the tracks which extend in parallel to the direction Y. For example, in this case, the tracks parallel to the direction X extend in a plane situated above the plane in which the tracks parallel to the direction Y extend. FIG. 19 shows an example of intersection of the tracks 44 and 46 in this particular case. A thermal switch 200 is interposed between the tracks 46 and 44. This thermal switch enables the tracks 44 and 46 to be thermally connected and alternately the tracks 44 and 46 to be thermally insulated. For example, this switch 200 is made like one of the thermal switches previously described. This makes it possible to direct the heat flow better and more selectively between a heat source and a cold point.

In another embodiment, the grating 40 can be omitted. In this case, as shown in FIG. 20, the end pads 52 and 53 are for example directly connected thermally to a respective electrode of the thermal switch 56. In this embodiment, preferably, the electronic modules 4 and 6 are superimposed on top of one another in the vertical direction.

The grating 40 does not necessarily extend in a horizontal plane alone. For example, the grating 40 can also comprise tracks extending in different horizontal planes positioned one on top of the other in the vertical direction. In this case, as shown in FIG. 21, the tracks extending in different parallel planes are preferably connected thermally to one another by means of a thermal switch 220 and a via hole 224 made of a thermally conductive material. In FIG. 21, the reference 226 designates a track extending in a horizontal plane parallel to the plane of the track 44. In this variant, the grating forms a 3D matrix and electronic modules can be positioned between the different planes of the grating.

As a variant in FIG. 21, the thermal switch 220 is omitted. In this case, the tracks extending in different parallel planes are thermally connected permanently by means of vertical thermal vias.

The directions in which the different tracks of the grating extend are not necessarily perpendicular to one another.

It is also possible for all the tracks of the grating to extend in one and the same direction.

It is not indispensable for all the tracks of the grating to have the same length. Indeed, their length can follow the placing of the electronic modules.

The material used for the grating 40 can be tungsten instead of copper if the temperature during the remaining part of the fabrication method is high, for example more than 350° C. or 400° C.

The thermally conductive tracks do not necessarily extend only in parallel to the plane of the substrate. For example, as a variant, the conductive track extends also perpendicularly to the plane of this substrate to be directly connected to other thermally conductive tracks situated in upper or lower parallel planes.

As a variant, several thicknesses of materials with variable thermal conductivity are stacked one on top of the other, for example in the vertical direction, to increase the ratio of the values $\lambda_c/\lambda_r$.

The different thermal switches of a same thermal bridge are not necessarily all identical. Thus, the different types of thermal switches previously described can be mixed in a same plate and in a same thermal bridge.

In another embodiment, the positions of the soluble electrode and the inert electrode are reversed.

Other thermally insulating materials can be used. For example, one material of average thermal conductivity that can become thermally insulating depending on to its geometry and thickness is silicon.

The thermal bridges can be integrated directly inside the integrated circuit and not attached by bonding of a plate to one face of this integrated circuit.

The electronic device or the plate may comprise several thermal bridges thermally insulated permanently from one another.

In other configurations, the heat source comprises heat-dissipating electronic components other than transistors. For example, these electronic components may be resistors or oscillating circuits containing inductors and capacitors. It does not necessarily comprise transistors.

The cold point is not necessarily an inactive electronic module. It may also relate to other elements capable of absorbing heat. For example, a cold point may be a pack housing the integrated circuit or a radiator (or sink) capable of diffusing heat in ambient air, or the like. The cold point may also be a channel passing through the integrated circuit and within which there flows a heat-carrying fluid.

As a variant, the control module 10 is integrated within the plate and not within the integrated circuit. Similarly, the network of sensors can be integrated within the plate rather that into the integrated circuit.

In another variant, the network of sensors is replaced by an estimator of temperatures of the electronic modules. For example, this estimator estimates the temperature or quantity of heat produced by a given electronic module as a function of the flow rate of information transmitted to this electronic module. Typically, an estimator of this kind is implanted within the control module 10.

In another embodiment, the control module is electrically connected to the grating 40 to make its voltage vary. In this embodiment, the pads 16 and 17 are electrically insulated from the module 10 and connected to a reference potential.

As a variant, the electrode 188 extends outside the cavity 174 and especially beyond the lid 172 to form a thermally conductive track. This thermally conductive track is then connected to a heat source or to a cold point. In this embodiment, the electronic modules do not need to be positioned and fixed to the roof of the lid 172 but can be separated from the lid 172 by a thermally insulating material.

In another variant, the strip 186 is flexible enough to return from its closed position to its open position once there is no difference in potentials applied between the electrode 188 and the track 176. Thus, in this embodiment, to keep the thermal switch in the conductive state it is necessary to permanently apply the difference in potentials. However, it is not necessary to apply a difference in potentials of an opposite sign to bring the strip to its open position.

The strip 186 can be shifted between its open and closed position by other actuators. For example, the track 176 and the strip 186 are made out of a magnetic material and it is a magnetic field that is used to shift the strip 186 between its two open and closed positions.

The integrated circuit is not necessarily a 3D integrated circuit. It can also be a 2D integrated circuit in which the electronic components are all distributed in a same plane. In one variant, the integrated circuit integrates MEMs (microelectromechanical systems) or NEMS (nanoelectromechanical systems). These MEMs or NEMs comprise at least one mechanical part which shifts or gets deformed in response to an addition of energy. The shifting or this deformation can produce heat. Thus, these MEMs can constitute a heat source which can be cooled by means of one of the previously described plates. For example, the mechanical part which shifts is a beam or a suspended membrane.

The invention claimed is:

1. An apparatus comprising an electronic device, said electronic device comprising:
   a heat-generating heat source;
   a cold point capable of absorbing heat;
   a thermally insulating material for insulating said heat source from said cold point, said thermally insulating material having a thermal conductivity at a use-temperature of said electronic device, said thermal conductivity being below a thermal-conductivity threshold;
   a thermal bridge, comprising a first end, which is connected to said heat source by an end pad, a second end, which is connected to said cold point by an end pad, and a thermal switch; said thermal bridge extending between said first end and said second end, wherein said thermal switch is capable of switching reversibly between a conductive state, in which a thermal conductivity at said use-temperature takes a first value above said thermal-conductivity threshold to thermally connect said end pads of said thermal bridge to each other, and a resistive state, in which said thermal conductivity at said use-temperature takes a second value below said first value to thermally insulate said two end pads of said thermal bridge from each other;
   said thermal switch comprising a material of variable thermal conductivity capable of switching over, in response to an addition of energy, between a conductive phase, in which a thermal conductivity of said material at said use-temperature attains said first value to thermally connect said end pads of said thermal bridge when said thermal switch is in said conductive state, and a resistive phase, in which said thermal conductivity of said material at said use-temperature attains said second value to thermally insulate said end pads of said thermal bridge from each other when said thermal switch is in said resistive state; and
   a control module for causing said thermal switch to switch between said conductive state and said resistive state.

2. The apparatus of claim 1, wherein said control module is configured to cause said thermal switch to automatically switch between said conductive state and said resistive state independently of information indicative of a temperature of one of said heat source and said cold point.

3. The apparatus of claim 1, wherein said second value is less than or equal to said thermal conductivity of said thermally insulating material at said use temperature.

4. The apparatus of claim 1, wherein said electronic device further comprises a block extending in a substrate plane, said block comprising a contact face in thermal contact with said heat source and said cold point, said block comprising a first material, said first material having a thermal conductivity, at a use-temperature of said plate, that is below said thermal-conductivity threshold, wherein said first and second ends of said thermal bridge are defined on said contact face, and wherein said electronic device further comprises a track made of a thermally conductive material to thermally connect said first and second ends, said track being buried inside said block so as to be separated from said contact face by said first material, said thermally conductive material having a thermal conductivity, at said use-temperature, that is above said thermal-conductivity threshold.

5. The apparatus of claim 1, wherein said material of variable thermal conductivity comprises a mixture of thermally insulating fluid and nanoparticles, said thermally insulating fluid having a value of thermal conductivity, at said use-temperature, that is less than or equal to said thermal-conductivity threshold, and wherein said nanoparticles have a value of thermal conductivity that is greater than or equal to said first value at said use-temperature, said nanoparticles being self-aligning along electrical field lines when an electric field is present.

6. The apparatus of claim 1, wherein said electronic device comprises several units of said thermal bridge extending between first and second respective ends, and wherein at least one of said heat source and cold point is capable of shifting, inside said electronic device, from a first end of a first of said thermal bridges to a distinct end of a second of said thermal bridges, wherein said control module is configured for, in response to shifting of said one of said heat source and cold point, identifying a thermal bridge that connects said heat source to said cold point, commanding a switch-over of a switch of said identified thermal bridge from said resistive state to said conductive state, and commanding switch-over of switches of thermal bridges that do not connect a heat source to a cold point from said conductive state to said resistive state.

7. The apparatus of claim 1, wherein a ratio of said first value to said second value is at least greater than or equal to two.

8. The apparatus of claim 1, wherein a ratio of said first value to said second value is at least greater than or equal to five.

9. The apparatus of device according to claim 1, wherein said control module is configured to cause said thermal switch to automatically switch between said conductive state and said resistive state as a function of information indicative of a temperature of one of said heat source and said cold point.

10. The device according to claim 9, wherein said electronic device comprises at least one of a sensor and an estimator for making a measurement of a physical parameter indicative of a temperature at one of said heat source and said cold point.

11. The apparatus of claim 1, wherein said material of variable thermal conductivity comprises a solid electrolyte.

12. The device according to claim 11, wherein said solid electrolyte comprises a metal sulfite.

13. The device according to claim 11, wherein said solid electrolyte comprises a germanium-based chalcogenide.

14. The device according to claim 11, wherein said solid electrolyte comprises ZnCdS.

15. The device according to claim 11, wherein said solid electrolyte comprises GdOx/Cu-Te.

16. An apparatus comprising a plate to direct heat within an electronic device, said plate comprising:
 a block extending in a substrate plane and having a contact face for thermal contact with a heat source and a cold point said block comprising:
  a first material having a thermal conductivity, at a use-temperature of said plate, that is below a thermal-conductivity threshold; and
  a thermal bridge comprising a first end defined on said contact face, and a second end defined on said contact face, said first and second ends of said thermal bridge being connected to said cold point and to said heat source by corresponding first and second end pads, said thermal bridge further comprising a track made of a thermally conductive material to thermally connect said first end and said second end, said track being buried inside said block so as to be separated from said contact face by said first material, said thermally conductive material having a thermal conductivity, at said use-temperature, that is above said thermal conductivity threshold;
  said thermal bridge further comprising, between at least one of said end pads and said track, a thermal switch capable of switching reversibly between a conductive state, in which said thermal conductivity, at said use-temperature, attains a first value above said conductivity threshold to thermally connect said two end pads of said thermal bridge, and a resistive state, in which said thermal conductivity, at said use-temperature, attains a second value below said first value to thermally insulate said end pads of said thermal bridge.

17. The plate according to claim 16, wherein said track extends between a first part in proximity to said first end pad and a second part in proximity to said second end pad, wherein a first thermal switch is placed between said first end pad and said first part of said track, and wherein a second thermal switch is placed between said second end pad and said second part of said track.

18. The plate according to claim 17, wherein said plate comprises several thermally conductive tracks forming a grating, at least one first track of this grating straddling a second track of said grating so that said first and second tracks face each other in a straddling region, and a third thermal switch interposed between said first and second tracks in said straddling region to thermally connect said first and second tracks and, alternately, to thermally insulate said first and second tracks in response to a switch-over command.

* * * * *